(12) United States Patent
Ryu et al.

(10) Patent No.: US 10,614,906 B2
(45) Date of Patent: Apr. 7, 2020

(54) SEMICONDUCTOR MEMORY DEVICES, MEMORY SYSTEMS AND METHODS OF OPERATING SEMICONDUCTOR MEMORY DEVICES

(71) Applicant: Samsung Electronics Co., Ltd., Suwon-si, Gyeonggi-do (KR)

(72) Inventors: Ye-Sin Ryu, Seoul (KR); Sang-Uhn Cha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 16/140,673

(22) Filed: Sep. 25, 2018

(65) Prior Publication Data

US 2019/0027230 A1 Jan. 24, 2019

Related U.S. Application Data

(63) Continuation-in-part of application No. 15/271,600, filed on Sep. 21, 2016, now Pat. No. 10,204,700.

(51) Int. Cl.
*G11C 29/42* (2006.01)
*G11C 29/44* (2006.01)
(Continued)

(52) U.S. Cl.
CPC .......... *G11C 29/42* (2013.01); *G06F 11/0793* (2013.01); *G06F 11/1048* (2013.01);
(Continued)

(58) Field of Classification Search
CPC . G11C 29/42; G11C 29/44; G11C 2029/0411; G06F 11/0793; G06F 11/1048; G06F 11/1076
See application file for complete search history.

(56) References Cited

U.S. PATENT DOCUMENTS 5,903,576 A 5/1999 Yoshiba
5,956,350 A 9/1999 Irrinki et al.
(Continued)

FOREIGN PATENT DOCUMENTS

KR 10-0809070 B1 3/2008

OTHER PUBLICATIONS

Banu, M.F., et al., "BIST using genetic algorithm for error detection and correction," IEEE—International Conference On Advances In Engineering, Science And Management, Conference Location: Nagapattinam, Tamil Nadu, India, Date of Conference: Mar. 30-31, 2012, pp. 588-592. (Year: 2012).*

*Primary Examiner* — Kyle Vallecillo
(74) *Attorney, Agent, or Firm* — Harness, Dickey & Pierce, P.L.C.

(57) ABSTRACT

A semiconductor memory device includes a memory cell array including a plurality of dynamic memory cells, an ECC engine configured to correct at least one error in a read data from the memory cell array, and a test circuit which performs a test on the memory cell array in a test mode of the semiconductor memory device by writing a test pattern data in the memory cell array and by reading, from the memory cell array, test result data corresponding to the test pattern data. When the test result data includes at least one error bit, the test circuit subtracts a second number from a first number of the at least one error bit and is configured to output the subtracted result to an outside of the semiconductor memory device. The second number corresponds to a number of error bits that the ECC engine is capable of correcting.

17 Claims, 17 Drawing Sheets

(51) Int. Cl.
  *G06F 11/07* (2006.01)
  *G06F 11/10* (2006.01)
  *G11C 29/04* (2006.01)

(52) U.S. Cl.
  CPC ......... *G06F 11/1076* (2013.01); *G11C 29/44* (2013.01); *G11C 2029/0411* (2013.01)

(56) References Cited

U.S. PATENT DOCUMENTS

| | | | |
|---|---|---|---|
| 6,097,206 A | 8/2000 | Takano | |
| 7,266,028 B1 | 9/2007 | Ghosh Dastidar | |
| 7,269,778 B1* | 9/2007 | Feng | H03M 5/145 |
| | | | 341/59 |
| 7,624,317 B2 | 11/2009 | Byun et al. | |
| 7,900,100 B2 | 3/2011 | Gollub | |
| 8,996,953 B2 | 3/2015 | Cordero et al. | |
| 9,087,612 B2 | 7/2015 | Franceschini et al. | |
| 9,575,125 B1 | 2/2017 | Andre et al. | |
| 2003/0107942 A1 | 6/2003 | Perner | |
| 2004/0184327 A1* | 9/2004 | Okuda | G11C 29/42 |
| | | | 365/199 |
| 2006/0020873 A1* | 1/2006 | Deolalikar | H03M 13/17 |
| | | | 714/777 |
| 2008/0082870 A1 | 4/2008 | Park | |
| 2008/0091979 A1* | 4/2008 | Okuda | G11C 29/42 |
| | | | 714/42 |
| 2008/0201620 A1 | 8/2008 | Gollub | |
| 2009/0044086 A1 | 2/2009 | Craske et al. | |
| 2013/0185611 A1* | 7/2013 | Goettfert | G06F 11/1008 |
| | | | 714/766 |
| 2015/0261632 A1 | 9/2015 | Kim et al. | |
| 2016/0351270 A1* | 12/2016 | Ehrlich | G11C 16/3418 |
| 2017/0102996 A1* | 4/2017 | Yu | G06F 11/1092 |
| 2017/0286219 A1* | 10/2017 | Chae | G06F 3/0619 |
| 2018/0074730 A1* | 3/2018 | Inoue | G06F 3/0619 |

* cited by examiner

SEMICONDUCTOR MEMORY DEVICES, MEMORY SYSTEMS AND METHODS OF OPERATING SEMICONDUCTOR MEMORY DEVICES

CROSS-REFERENCE TO RELATED APPLICATION

This application is a continuation-in-part application of U.S. application Ser. No. 15/271,600 filed on Sep. 21, 2016, the entire content of which is incorporated herein by reference in its entirety.

BACKGROUND

Semiconductor memory devices may be classified into non-volatile memory devices such as flash memory devices and volatile memory devices such as dynamic random access memories (DRAMs). High speed operation and cost efficiency of DRAMs make it possible for DRAMs to be used for system memories.

SUMMARY

Example embodiments relate to semiconductor memory devices, memory systems and methods of operating semiconductor devices.

Some example embodiments may provide a semiconductor memory device capable of reducing overhead of test time and increasing test accuracy.

Some example embodiments may provide a memory system capable of reducing overhead of test time and increasing test accuracy.

Some example embodiments may provide a method of operating a semiconductor memory device, capable of reducing overhead of test time and increasing test accuracy.

According to some example embodiments, a semiconductor memory device includes a memory cell array including a plurality of dynamic memory cells, an error correction code (ECC) engine configured to correct at least one error in a read data from the memory cell array, and a test circuit configured to perform a test on the memory cell array in a test mode of the semiconductor memory device by writing a test pattern data in the memory cell array and by reading, from the memory cell array, test result data corresponding to the test pattern data. In the test mode, when the test result data includes at least one error bit, the test circuit is configured to determine a subtracted result by subtracting a second number from a first number of the at least one error bit and is configured to output the subtracted result to an outside of the semiconductor memory device. The second number corresponds to a number of error bits that the ECC engine is capable of correcting.

According to some example embodiments, a memory system includes a semiconductor memory device, the semiconductor memory device including a memory cell array, an error correction code (ECC) engine and a test circuit, and a test device configured to control a test of the semiconductor memory device, the test device including a first fail address memory and a second fail address memory. In a test mode of the semiconductor memory device, the test circuit is configured to perform a first test on the memory cell array to generate a first test result, to subtract a second number from a first number of at least one error bit of the first test result to selectively record in the first fail address memory a first result signal associated with the first test, to perform a second test on the memory cell array to generate a second test result, and to subtract the second number from the second test result, to record in the second fail address memory a second result signal associated with the second test, the test circuit configured to perform the first test and the second test based on a test pattern data from the test device. The second number corresponds to a number of error bits that the ECC engine is capable of correcting.

According to some example embodiments, a method of operating a semiconductor memory cell array including a memory cell array, an error correction code (ECC) engine and a test circuit comprises performing, by the test circuit, a parallel bit test (PBT) on a plurality of dynamic memory cells in the memory cell array according to a first scheme to generate a first test result, subtracting a second number from a first number of at least one error bit of the first test result, selectively recording a first result signal in a first fail address memory, the second number corresponding to a number of error bits that the ECC engine is capable of correcting, subtracting, by the test circuit a PBT on the plurality of dynamic memory cells according to a second scheme to generate a second test result, the second number from the second test result, recording a second result signal in a second fail address memory, recording selected second test result of the at least one second test result in the first fail address memory, wherein the selected second test result is associated with uncorrectable errors exceeding an error correction threshold of the ECC engine, and performing a redundancy repair operation on cells of the memory cells associated with the uncorrectable errors by referring to the first fail address memory Accordingly, when a semiconductor memory device employs an error correction code, test time overhead may be reduced and a number of fail bits, which are transmitted to the fail address memory may be reduced while performing PBT and uncorrectable errors may be prevented, or reduced, from being interpreted as correctable errors.

BRIEF DESCRIPTION OF THE DRAWINGS

Example embodiments will be described below in more detail with reference to the accompanying drawings.

DETAILED DESCRIPTION OF EXAMPLE EMBODIMENTS

Various example embodiments will be described more fully hereinafter with reference to the accompanying drawings, in which some example embodiments are shown.

Figure 1:
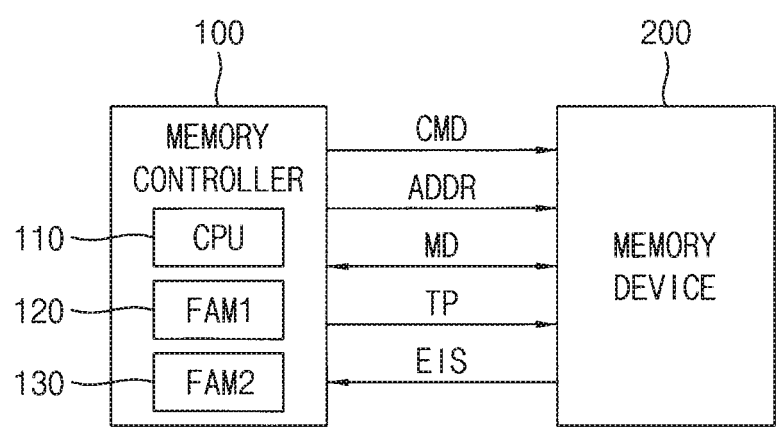
FIG. 1 is a block diagram illustrating a memory system according to at least one example embodiment.

FIG. 1 is a block diagram illustrating a memory system according to at least one example embodiment.

Referring to FIG. 1, a memory system 10 includes a memory controller 100 and at least a semiconductor memory device 200.

The memory controller 100 may control an overall operation of the memory system 10. The memory controller 100 may control an overall data exchange between a host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In some example embodiments, the semiconductor memory device 200 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), or a Rambus dynamic random access memory (RDRAM), etc.

The memory controller 100 and the semiconductor memory device 200 may be connected to each other through corresponding command pins (or pads). The memory controller 100 may transmit a command CMD and address ADDR to the semiconductor memory device 200 through corresponding pins and may exchange main data MD with the semiconductor memory device 200 during a normal mode. The memory controller 100 may transmit a test pattern data TP to the semiconductor memory device 200 through corresponding pins and receive error information signal EIS indicating a test result from the semiconductor memory device 200 during a test mode.

When the memory controller 100 perform a test on the semiconductor memory device 200 during the test mode, a central processing unit (CPU) 110 records results of test performed on the semiconductor memory device 200 in a first fail address memory 120 and a second fail address memory 130 and may determine a repair policy of the semiconductor memory device 200 by referring to the recorded test results.

Figure 2:
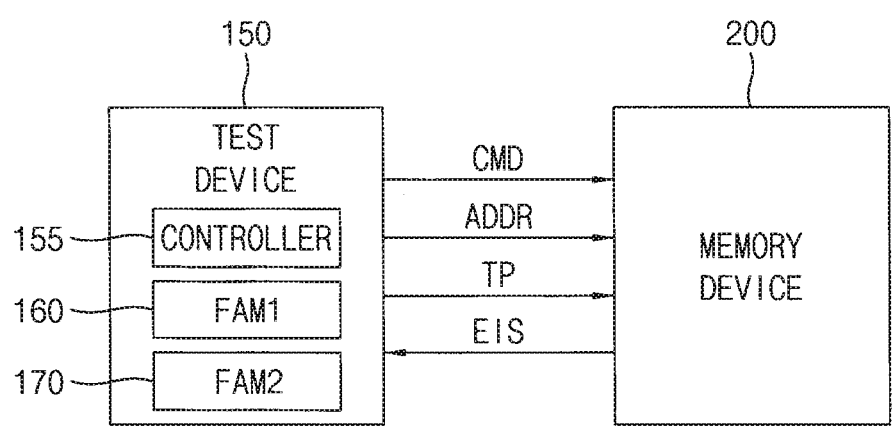
FIG. 2 is a block diagram illustrating a memory system according to at least one example embodiment.

FIG. 2 is a block diagram illustrating a memory system according to at least one example embodiment.

Referring to FIG. 2, a memory system 40 may include a test device 150 and a semiconductor memory device 200. The memory system 40 may be also referred to as a test system.

The test device 150 may include a controller 155, a first fail address memory 160 and a second fail address memory 170.

The test device 150, in a test mode of the semiconductor memory device 200, applies a command CMD indicating the test mode to the semiconductor memory device 200 through a command pin, applies an address ADDR designating memory cells to be tested to the semiconductor memory device 200 through an address pin, and applies a test pattern data TP to the semiconductor memory device 200 through a data pin.

The semiconductor memory device 200 performs a first test and a second test on dynamic memory cells in the semiconductor memory device 200 based on the test pattern data TP, may subtract error correction capability of the ECC engine in the semiconductor memory device 200 from test results and may provide the test device 150 with error information signal EIS including a first test result signal and a second result signal which indicate a subtracted result. The first test result signal may be selectively recorded in the first fail address memory 160 and the second test result signal may be recorded in the second fail address memory 170. The semiconductor memory device 200 may record the first test result in the fail address memory 160 only when a result of the first test indicates that a number of errors in the memory cells exceeds error correction capability (threshold) of the ECC engine in the semiconductor memory device 200.

The controller 155 may further record selected second test result of the second test result in the first fail address memory 160, and the selected second test result is associated with uncorrectable errors that exceed error correction capability of the ECC engine. The test device 150 may repair fail cells associated with the uncorrectable errors by redundancy repair operation by referring to the first fail address memory.

Figure 3:
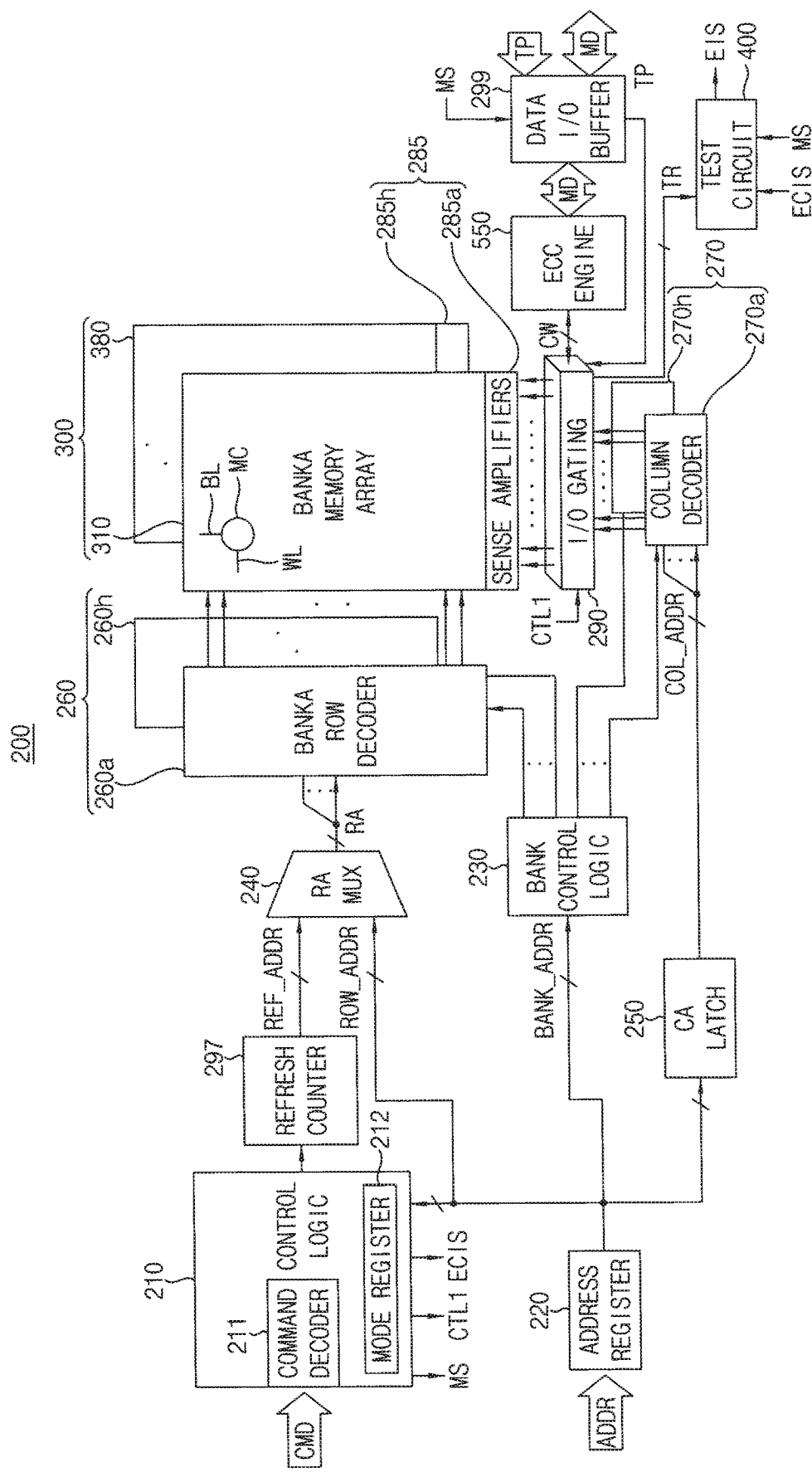
FIG. 3 is a block diagram illustrating a semiconductor memory device shown in FIGS. 1 and 2.

FIG. 3 is a block diagram illustrating the semiconductor memory device shown in FIGS. 1 and 2.

Referring to FIG. 3, the semiconductor memory device 200 may include a control logic circuit 210, an address register 220, a bank control logic 230, a refresh counter 297, a row address (RA) multiplexer 240, a column address (CA) latch 250, a row decoder 260, a column decoder 270, a memory cell array 300, a sense amplifier unit 285, an input/output (I/O) gating circuit 290, an ECC engine 550, a data input/output (I/O) buffer 299, and a test circuit 400.

The memory cell array 300 may include first through eighth bank arrays 310-380. The row decoder 260 may include first through eighth bank row decoders 260a-260h respectively coupled to the first through eighth bank arrays 310-380, the column decoder 270 may include first through eighth bank column decoders 270a-270h respectively coupled to the first through eighth bank arrays 310-380, and the sense amplifier unit 285 may include first through eighth bank sense amplifiers 285a-280h respectively coupled to the first through eighth bank arrays 310-380. Each of the first through eighth bank arrays 310-380 may include a plurality of memory cells MC, and each of memory cells MC is coupled to a corresponding word-line WL and a corresponding bit-line BL. The first through eighth bank arrays 310-380, the first through eighth bank row decoders 260a-260h, the first through eighth bank column decoders 270a-270h and first through eighth bank sense amplifiers 285a-285h may form first through eighth banks. Although the semiconductor memory device 200 shown in FIG. 3 illustrates eight banks, the semiconductor memory device 200 may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a-260h corresponding to the bank address BANK_ADDR may be activated in response to the bank control signals, and one of the first through eighth bank column decoders 270a-270h corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through eighth bank row decoders 260a-260h.

The activated one of the first through eighth bank row decoders 260a-260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270a-270h.

The activated one of the first through eighth bank column decoders 270a-270h may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank arrays 310-380, and write drivers for writing data to the first through eighth bank arrays 310-380.

Codeword CW read from one bank array of the first through eighth bank arrays 310-380 may be sensed by sense amplifiers coupled to the one bank array from which the data is to be read, and may be stored in the read data latches. The codeword CW stored in the read data latches may be provided to the memory controller 100 through the ECC engine 550 and the data I/O buffer 299. Main data MD to be written in one bank array of the first through eighth bank arrays 310-380 may be provided to the data I/O buffer 299 from the memory controller 100. The main data MD provided to the data I/O buffer 299 is encoded to the codeword CW in the ECC engine 550. The write driver may write the codeword CW in one bank array of the first through eighth bank arrays 310-380.

The data I/O buffer 299 receives the test pattern data TP from the test device 150 or the memory controller 100 in a test mode, and provides the test pattern data TP to the test circuit 400. The test circuit 400 provides the test pattern data TP to the I/O gating circuit 290. The I/O gating circuit 290 writes the test pattern data TP to a target page of the memory cell array 300 and reads the test pattern data TP from the target page to provide test result data TR to the test circuit 400 in a test mode.

The test circuit 400 may perform a first test on the memory cell array 300 and may subtract a second number of error bits that the ECC engine 550 is capable of correcting from a first number of error bits of a first test result to selectively record a first subtracted result associated with the first test in the first fail address memory 160 and may perform a second test on the memory cell array 300 and may subtract the second number from a second test result to record a second subtracted result associated with the second test in the second fail address memory 170, based on the test pattern data TP in the test mode.

The test circuit 400 may write the test pattern data TP in the memory cell array 300, read a first size of the test pattern data TP as a first size of test result data and compare corresponding bits of the first size of the test result data and the test pattern data TP stored therein to generate a comparison signal. The test circuit 400 may perform the first test by comparing bits of each first unit in the comparison signal while counting a number of errors in the test result data and may perform the second test by comparing corresponding bits in the first units in the comparison signal as each second unit while comparing the bits of each first unit.

The test circuit 400 may transmit a first test result signal corresponding to first subtracted result and a second test result signal corresponding to the second subtracted result as the error information signal EIS to the test device 150. The first test result signal corresponds to a result of the first test and the second test result signal corresponds to a result of the second test.

The ECC engine 550 generates parity data based on the main data MD from the data I/O buffer 299 in a write operation of a normal mode, and provides the I/O gating circuit 290 with the codeword CW including the main data MD and the parity data. The I/O gating circuit 290 writes the codeword CW to the target page of the memory cell array 300.

In addition, in a read operation of the normal mode, the ECC engine 550 receives the codeword CW which is read from the target page from the I/O gating circuit 290. The ECC engine 550 decodes the main data MD using the parity data in the codeword CW, corrects a single bit error in the main data MD and provides the data I/O buffer 299 with the error-corrected main data.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes a command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The command decoder 211 may generate a mode signal MS directing an operation mode of the semiconductor memory device 200 and an error correction capability information signal ECIS indicating an error correction threshold of the ECC engine 550 by decoding the command CMD and may generate a control signal CTL1. The control logic circuit 210 may provide the mode signal MS to the data I/O buffer 299 and the test circuit 400, may provide the error correction capability information signal ECIS to the test circuit 400 and may provide the control signal CTL1 to the I/O gating circuit 290.

The mode signal MS indicates one of the test mode and the normal mode of the semiconductor memory device 200.

In addition, in an example embodiment, a three dimensional (3D) memory array is provided in semiconductor memory device 200.

Figure 4:
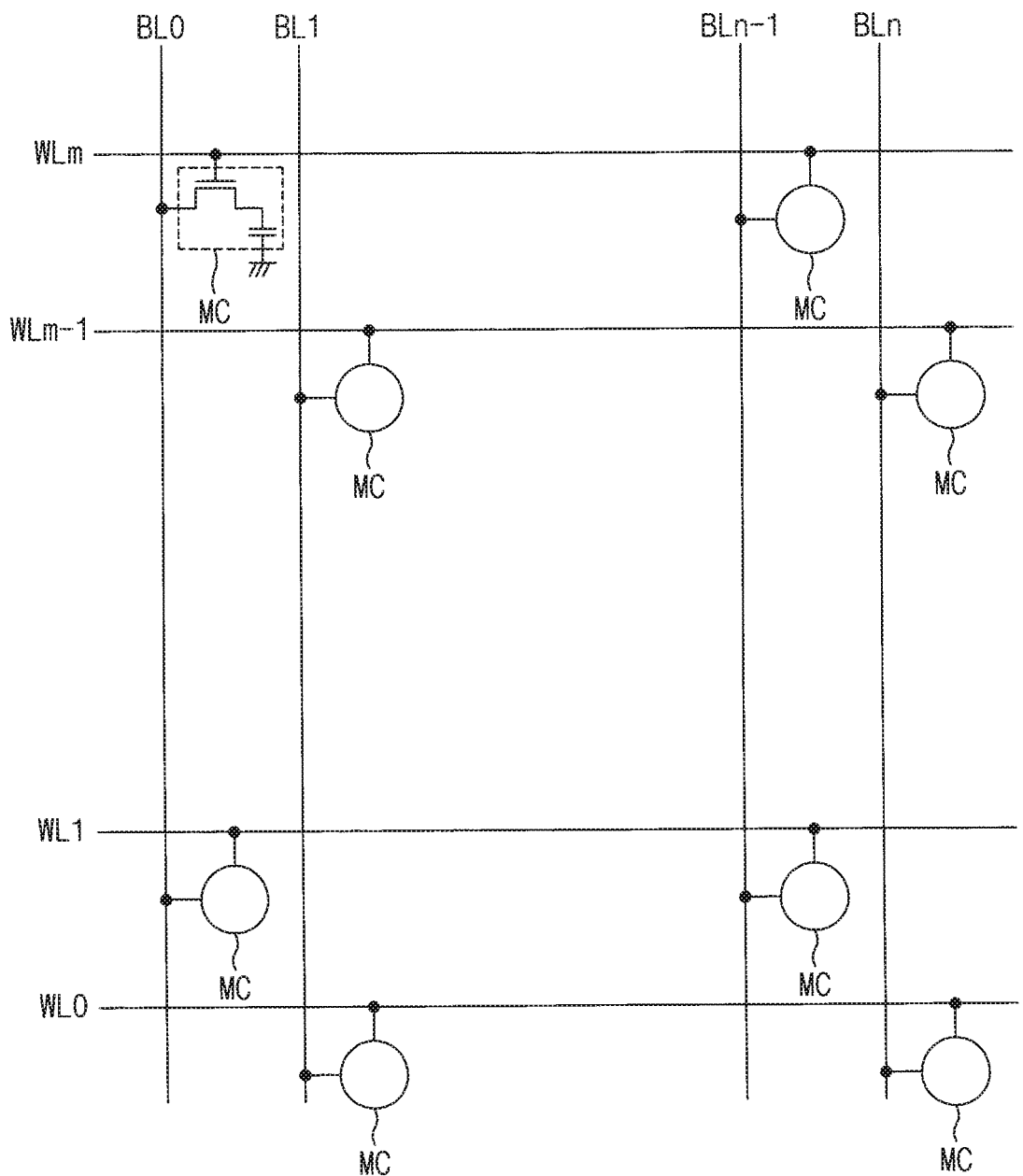
FIG. 4 is a block diagram illustrating an example of one bank array in the semiconductor memory device of FIG. 3 according to at least one example embodiment.

FIG. 4 is a block diagram illustrating an example of one bank array in the semiconductor memory device of FIG. 3 according to at least one example embodiment.

Referring to FIG. 4, each of the bank arrays 310-380 may include a plurality of memory cells are arranged in columns and rows. Each of the bank arrays 310-340 may include a plurality of word-lines WL0-WLm (m is natural number greater than 2), a plurality of bit-lines BL0-BLn (n is a natural number greater than 2), and a plurality of memory cells MCs disposed near intersections between the word-lines WL0-WLm and the bit-lines BL0-BLn. In one example embodiment, each of the plurality of memory cells MCs may include a dynamic random access memory (DRAM) cell structure.

Figure 5:
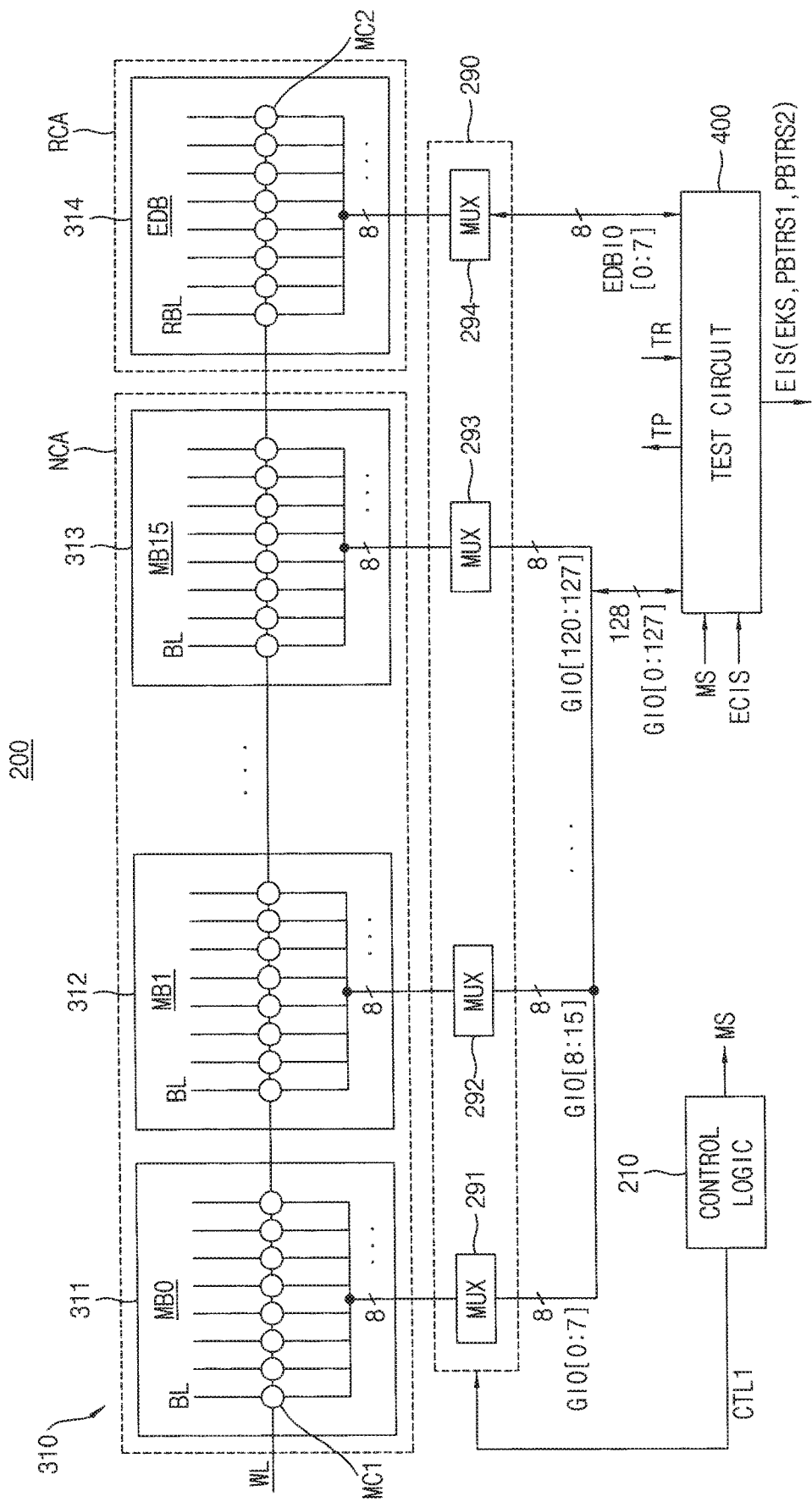
FIG. 5 illustrates a portion of the semiconductor memory device of FIG. 3 in a test mode according to at least one example embodiment.

FIG. 5 illustrates a portion of the semiconductor memory device of FIG. 3 in a test mode.

In FIG. 5, the first bank array 310, the I/O gating circuit 290, the test circuit 400, and the control logic circuit 210 are illustrated.

Referring to FIG. 5, the first bank array 310 may include a normal cell array NCA and a redundancy cell array RCA. The normal cell array NCA may include a plurality of first memory blocks MB0-MB15, e.g., 311-313, and the redundancy cell array RCA may include at least a second memory block 314. The first memory blocks 311-313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311-313, the second memory block is also referred to as an EDB block.

In each of the first memory blocks 311-313, a plurality of first memory cells MC1 are arrayed in rows and columns. In the second memory block 314, a plurality of second memory cells MC2 are arrayed in rows and columns.

In the first memory blocks 311-313, rows may be formed, for example, of 8K word-lines WL and columns may be formed, for example, of 1K bit-lines BL. Memory cells connected to intersections of the word-lines WL and the bit-lines BL may be dynamic memory cells.

The I/O gating circuit 290 includes a plurality of switching circuit 291-294 circuits respectively connected to the first memory blocks 311-313 and the second memory block 314. In the semiconductor memory device 200, bit lines corresponding to data of a burst length may be simultaneously accessed to support the burst length indicating the maximum number of column locations that is accessible. For example, if the burst length is set to 8, data bits may be set to 128 bits.

The test circuit 400 is connected to the switching circuits 291-294 through corresponding first data lines GIO[0:127] and second data lines EDBIO[0:7]. The test circuit 400, in a test mode, writes the test pattern data TP in the first memory blocks 311-313 and the second memory block 314 reads test result data TR corresponding to the test pattern data TP, compares corresponding bits of test pattern data TP and the test result data TR to generate a comparison signal and generates an error kind signal EKS indicating whether the test result data TR includes errors that exceed error correction capability of the ECC engine 550 in response to the mode signal MS and the error correction capability information signal ECIS.

The test circuit 400 compares each first unit in bits of the comparison signal to generate a first intermediate result signal, subtracts the second number corresponding to the error correction threshold of the ECC engine 550 from the first intermediate result signal and records a first subtracted result as a first test result signal PBTRS1 in the first fail address memory 160. The test circuit 400 compares corresponding bits in the first units as each second unit to generate a second intermediate result signal, subtracts the second number from the second intermediate result signal and records a second subtracted result as a second test result signal PBTRS2 in the second fail address memory 170.

Figure 6:
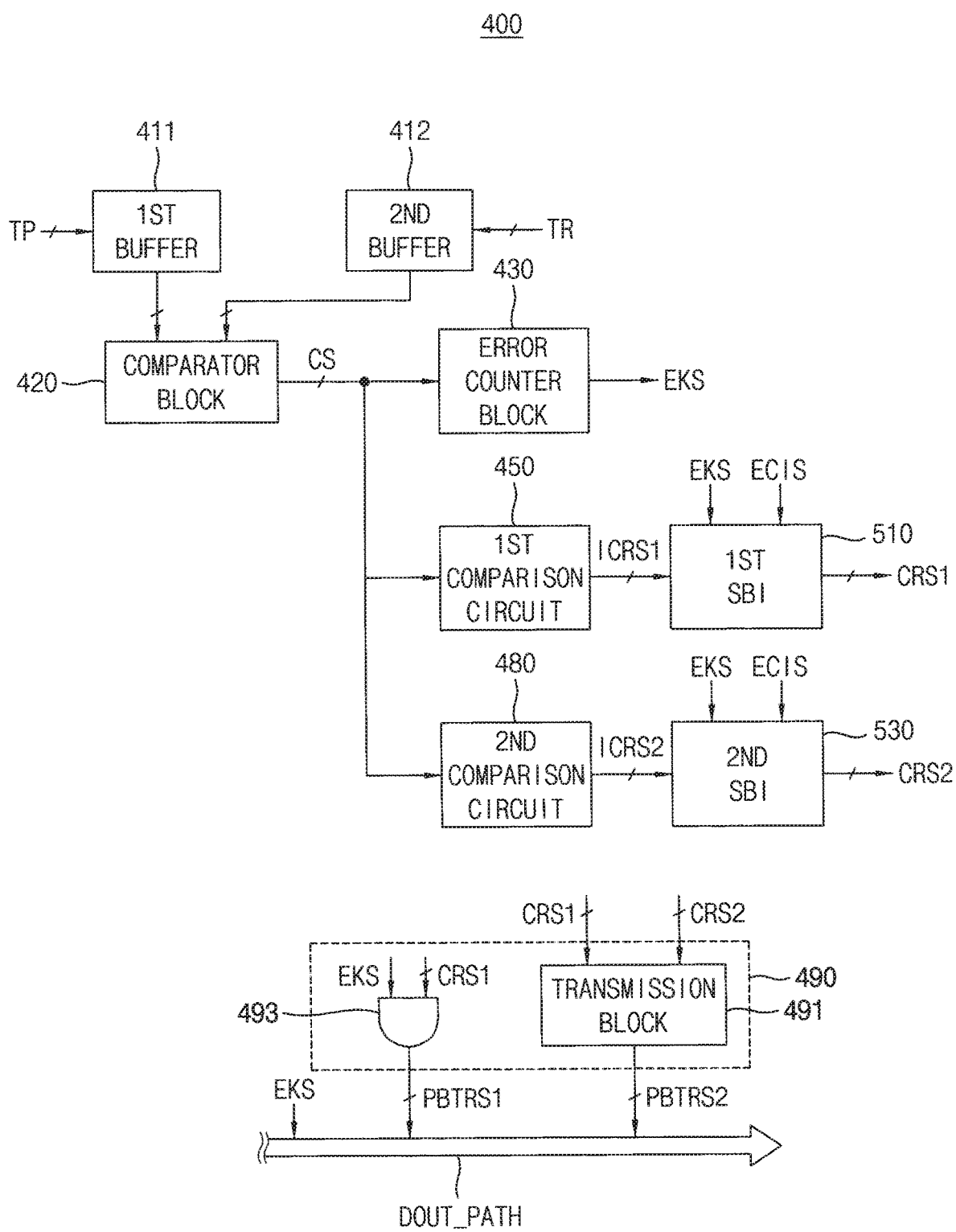
FIG. 6 is a block diagram illustrating a test circuit shown in the semiconductor memory device of FIG. 3 according to at least one example embodiment.

FIG. 6 is a block diagram illustrating the test circuit shown in the semiconductor memory device of FIG. 3.

Referring to FIG. 6, the test circuit 400 a first buffer 411, a second buffer 412, a comparator block 420, an error counter block 430, a first comparison circuit 450, a second comparison circuit 480, a first selective blocking interface 510, a second selective blocking interface 530 and a transmission circuit 490.

The first buffer 411 stores the test pattern data TP from the data I/O buffer 299 in the test mode. The I/O gating circuit 290 writes the test pattern data TP to the target page of the memory cell array 300. The second buffer 412 stores the test result data TR read from the target page of the memory cell array 300. The comparator block 420 is coupled to the first buffer 411 and the second buffer 412, compares corresponding bits of the test pattern data TP and the test result data TR and outputs comparison signal CS indicating the comparison result. The comparator block 420 may provide the comparison signal CS to the error counter block 430, the first comparison circuit 450 and the second comparison circuit 480.

The error counter block 430 may provide the transmission circuit 490 with the error kind signal EKS having a logic level according to a number of errors associated with the test result data TR based on the comparison signal CS having a first size of bits. The error kind signal EKS has a first logic level (low level) when the number of errors associated with the test result data TR is within error correction capability of the error correction circuit 360. The error kind signal EKS has a second logic level (high level) when the number of errors associated with the test result data TR is beyond error correction capability of the error correction circuit 360 (uncorrectable errors).

The first comparison circuit 450 may compare the bits of each first unit in the first size of comparison signal CS to output a first intermediate result signal ICRS1 and the second comparison circuit 480 may compare corresponding bits in the first units as each second unit to output a second intermediate result signal ICRS2. The first size may correspond to codeword size of the semiconductor memory device 200 and the first unit may correspond to a burst length of the semiconductor memory device 200.

The first selective blocking interface 510 may receive the first intermediate result signal ICRS1 may subtract the second number indicating the error correction threshold of the ECC engine 550 from the first intermediate result signal ICRS1 in response to the error correction capability information signal ECIS and the error kind signal EKS to output a first result signal CRS1 to the transmission circuit 490.

The second selective blocking interface 530 may receive the second intermediate result signal ICRS2 may subtract the second number from the second intermediate result signal ICRS2 in response to the error correction capability information signal ECIS and the error kind signal EKS to output a second result signal CRS2 to the transmission circuit 490.

The transmission circuit 490 includes a transmission block 491 and an AND gate 493. The AND gate 493 performs an AND operation on the error kind signal EKS and the first result signal CRS1 to output the first test result signal PBTRS1. Therefore, the first test result signal PBTRS1 may have the same logic level as the first result signal CRS1 when the error kind signal EKS indicates the uncorrectable errors. Therefore, the first test result signal PBTRS1 may be recorded in the first fail address memory 160 only when the first result signal CRS1 indicates the uncorrectable errors reflecting the second number.

The transmission block 491 may output the first result signal CRS1 and the second result signal CRS2 as the second test result signal PBTRS2. The transmission circuit 490 may transmit the error kind signal EKS, the first test result signal PBTRS1 and the second test result signal PBTRS2 to the test device 150 or the memory controller 100 as the error information signal EIS through a data output path DOUT_PATH of the semiconductor memory device 200.

Figure 7:
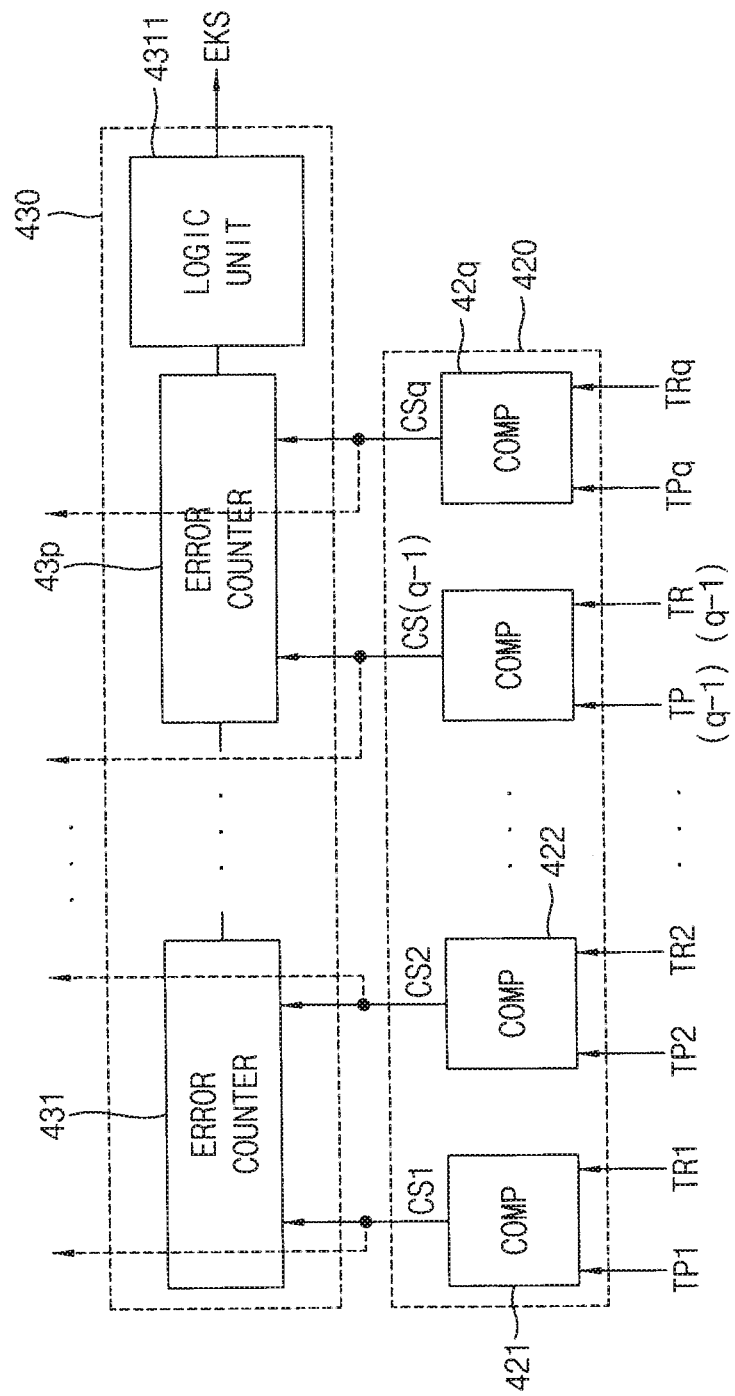
FIG. 7 illustrates a comparator block and an error counter block in the test circuit of FIG. 6 according to at least one example embodiment.

FIG. 7 illustrates the comparator block and the error counter block in the test circuit of FIG. 6.

Referring to FIGS. 6 and 7, the comparator block 420 may include a plurality of comparators 421-42q (q is a natural number greater than 3), and each of the comparators 421-42q compares each of corresponding bits TP1 and TR1-TPq and TRq of the test pattern data TP and the test result data TR to output corresponding bit of the comparison signal CS1-CSq.

The error counter block 430 includes a plurality of error counters 431-43p (p is a natural number greater than 1) and a logic unit 4311. Each of the error counters 431-43p receives two bits of the comparison signal CS and counts a number of errors in the two bits. The logic unit 4311 outputs the error kind signal EKS based on the outputs of the error counters 431-43p. The logic unit 4311 may be connected to the error counter 43p. The logic unit 4311 may include an OR gate.

Figure 8:
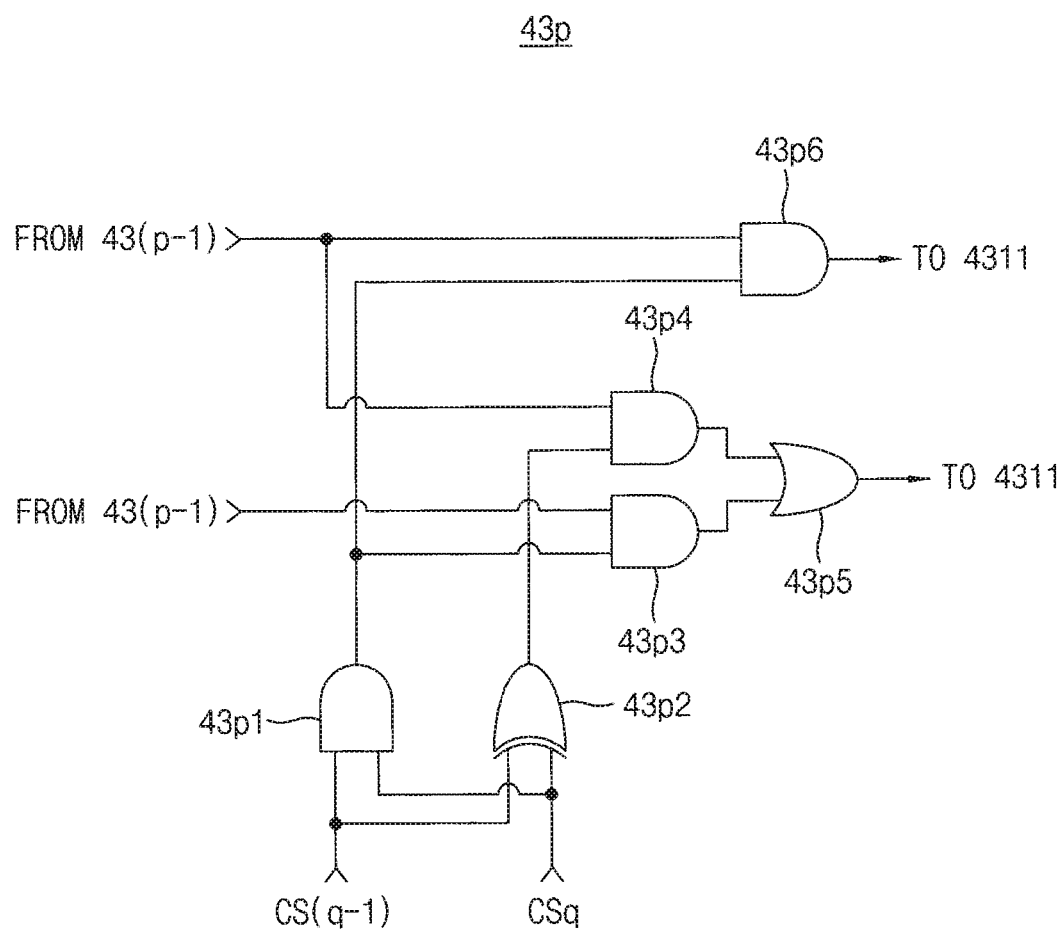
FIG. 8 illustrates one of error counters in FIG. 7 according to at least one example embodiment.

FIG. 8 illustrates one of the error counters in FIG. 7 according to at least one example embodiment.

Referring to FIG. 8, the error counter 43p includes an AND gate 43p1, an XOR gate 43p2, AND gates 43p3 and 43p4, an OR gate 43p5 and an AND gate 43p6.

The AND gate 43p1 performs AND operation on two most significant bits CS(q-1) and CSq and the XOR gate 43p2 performs XOR operation on the two most significant bits CS(q-1) and CSq. The AND gate 43p3 performs AND operation an output of the adjacent error counter 43(p-1) and an output of the AND gate 43p1 and the AND gate 43p4 performs AND operation on the output of the adjacent error counter 43(p-1) and an output of the XOR gate 43p2. The OR gate 43p5 performs OR operation on outputs of the AND gates 43p3 and 43p4 to output a result of the OR operation and the AND gate 43p6 performs the output of the adjacent error counter 43(p-1) and the output of the AND gate 43p1 to output a result of the AND operation.

The logic unit 4311 outputs the error kind signal EKS with a low level when the comparison signal CS indicates no error or correctable error. The logic unit 4311 outputs the error kind signal EKS with a high level when the comparison signal CS indicates uncorrectable errors.

Figure 9:
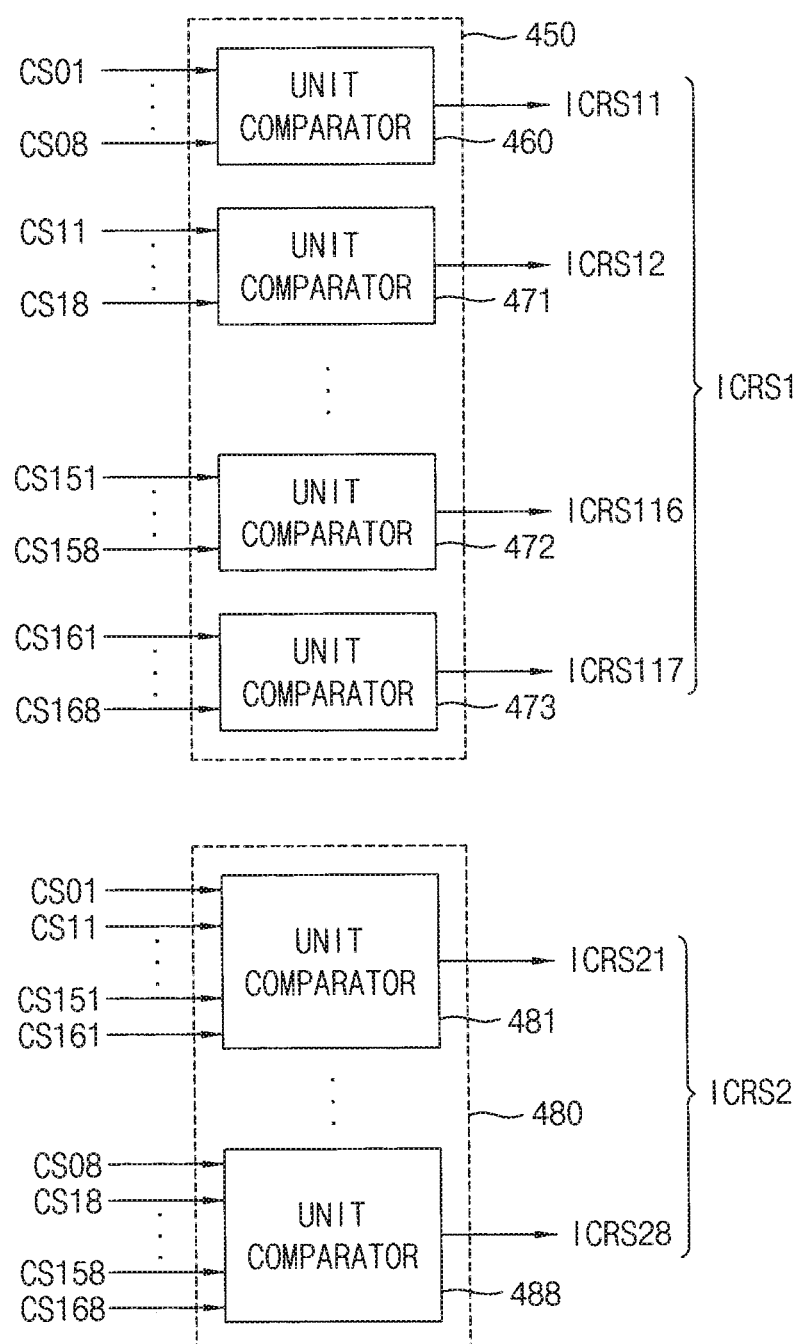
FIG. 9 is a block diagram illustrating a first comparison circuit and a second comparison circuit in the test circuit of FIG. 6 according to at least one example embodiment.

FIG. 9 is a block diagram illustrating the first comparison circuit and the second comparison circuit in the test circuit of FIG. 6.

Referring to FIG. 9, the first comparison circuit 450 compares the bits in each first unit of the comparison signal CS to output the first intermediate result signal ICRS1 and the second comparison circuit 480 compares the corresponding bits in each first unit as the second unit to output the second intermediate result signal ICRS2.

The first comparison circuit 450 may include a plurality of first unit comparators 460 and 471-473 and the second comparison circuit 480 may include a plurality of second unit comparators 481-488.

The unit comparator 460 receives the first unit of bits of the comparison signal CS01-CS08, and compares whether the first unit of bits of the comparison signal CS01-CS08 are same with respect to each other to output a first bit ICRS11 of the first intermediate result signal ICRS1, which indicates the comparison result. The unit comparator 471 receives the first unit of bits of the comparison signal CS11-CS18 and compares whether the first unit of bits of the comparison signal CS11-CS18 are same with respect to each other to output a second bit ICRS12 of the first intermediate result signal ICRS1, which indicates the comparison result. The unit comparator 472 receives the first unit of bits of the comparison signal CS151-CS158 and compares whether the first unit of bits of the comparison signal CS151-CS158 are same with respect to each other to output a sixteenth bit ICRS116 of the first intermediate result signal ICRS1, which indicates the comparison result. The unit comparator 473 receives the first unit of bits of the comparison signal CS161-CS168 and compares whether the first unit of bits of the comparison signal CS161-CS168 are same with respect to each other to output a seventeenth bit ICRS117 of the first intermediate result signal ICRS1, which indicates the comparison result.

The unit comparator 481 compares whether first bits CR01, CR11, . . . , CR151, TR161 in the first units of the comparison signal as the second unit are same with respect to each other and outputs a first bit ICRS21 of the second intermediate result signal ICRS2, which indicates the comparison result. The unit comparator 488 compares whether eighth bits CR08, CR18, . . . , CR158, CR168 in the first units of comparison signal as the second unit are same with respect to each other and outputs an eighth bit ICRS28 of the second intermediate result signal ICRS2, which indicates the comparison result.

Figure 10:
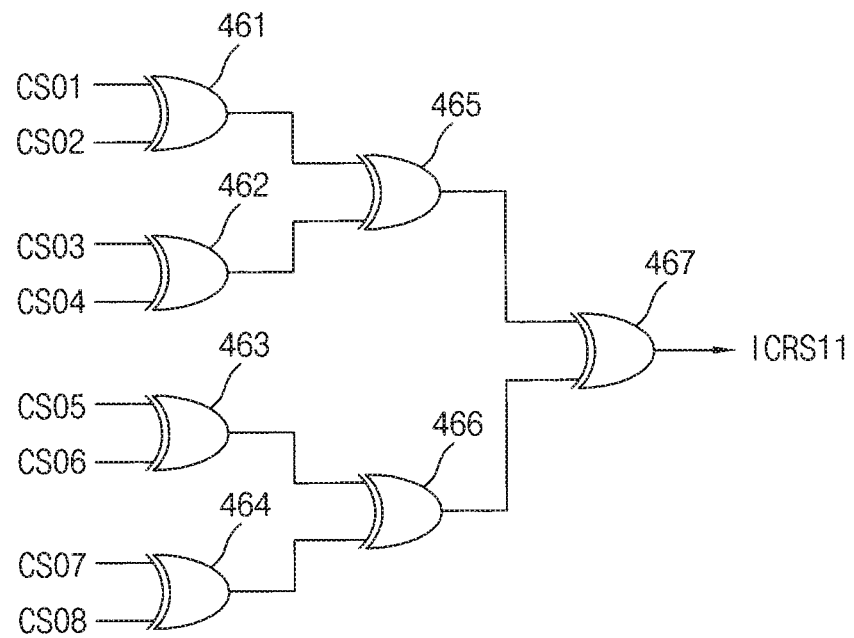
FIG. 10 illustrates one of first unit comparators shown in FIG. 9 according to an example embodiment.

FIG. 10 illustrates one of the first unit comparators shown in FIG. 9.

Although FIG. 10 illustrates the first unit comparator 460, each of the unit comparators 471, 472 and 473 has a substantially same configuration as the first unit comparator 460.

Referring to FIG. 10, the first unit comparator 460 includes a plurality of XOR gates 461-467.

Each of the XOR gates 461-464 compare two bits of the first unit of the bits of the comparison signal CS01-CS08. The XOR gate 465 compares outputs of the XOR gates 461 and 462, the XOR gate 466 compares outputs of the XOR gates 463 and 464, and XOR gate 467 compares outputs of the XOR gates 465 and 466 to output the first bit ICRS11 of the first intermediate result signal ICRS1, which indicates whether the bits of the comparison signal CS01-CS08 are same with respect to each other.

Each of the unit comparators 481 and 488 of the second comparison circuit 480 may have a similar configuration with the first unit comparator 460.

Figure 11:
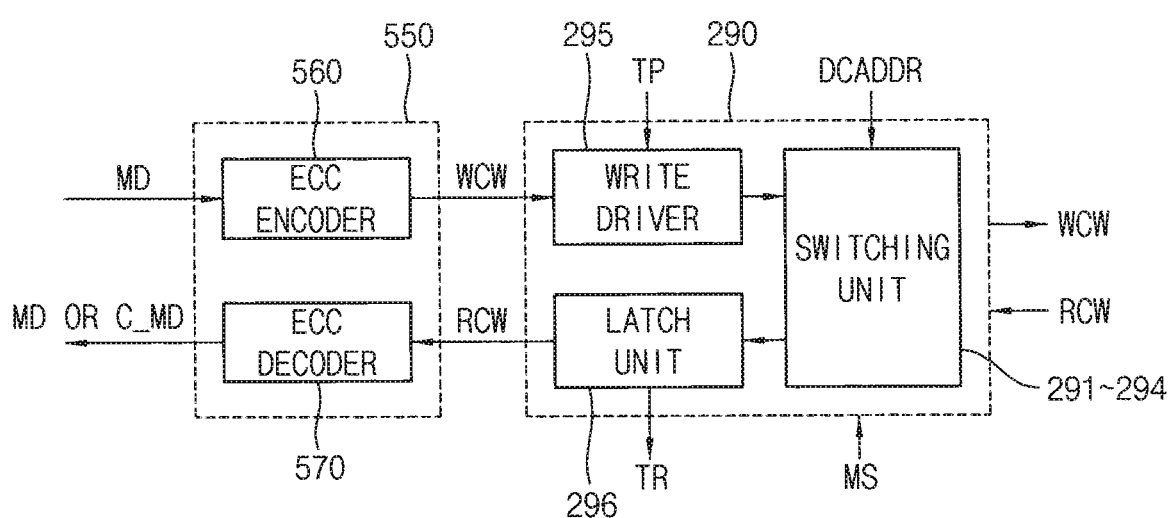
FIG. 11 illustrates the ECC engine and the I/O gating circuit in the semiconductor memory device of FIG. 3 according to at least one example embodiment.

FIG. 11 illustrates the ECC engine and the I/O gating circuit in the semiconductor memory device of FIG. 3 according to at least one example embodiment.

Referring to FIG. 11, the ECC engine 550 includes an ECC encoder 560 and an ECC decoder 570. The I/O gating circuit 290 includes a switching unit 291-294, a write driver 295 and a latch unit 296. The ECC encoder 560 and the ECC decoder 570 may be implemented with any suitable means capable of performing the operations of the ECC encoder 560 and the ECC decoder 590, such as various hardware and/or software executing on a processor, circuits, and/or modules. The software may comprise an ordered listing of machine-readable executable instructions for implementing logical functions, and can be embodied in any computer-readable medium. The ECC encoder 560 and the ECC decoder 570 described herein may be embodied directly in hardware, in a software module executed by a processor, or in a combination of the two. If implemented in software executed by a processor, the functions may be stored as one or more instructions or code on a tangible, non-transitory computer-readable medium. For example, the software executed by a processor may reside in a random access memory (RAM), a flash memory, a read-only memory (ROM), an electrically programmable read-only memory (EPROM), an electrically erasable programmable read-only memory (EEPROM), registers, and/or any other form of storage medium known to one of ordinary skill in the art.

The ECC encoder 560 receives the main data MD including a plurality of unit data, encodes the main data MD to generate the parity data and provides the write driver 295 with the codeword (or a write codeword) WCW having the main data MD and the parity data in a write operation of a normal mode. The ECC decoder 570 receives the codeword (or a read codeword) RCW from the I/O gating circuit 290, corrects errors in the main data MD using the parity data in the codeword RCW and provides the corrected main data MD or C_MD to the memory controller 100 though the data I/O buffer 299 in a read operation of a normal mode.

The switching unit 291-294 gates the write codeword WCW from the write driver 295 to the memory cell array 300 in response to a decoded column address DCADDR and gates the read codeword RCW from the memory cell array 300 to the latch unit 296 in a normal mode. The switching unit 291-294 gates the test pattern data TP from the write driver 295 to the memory cell array 300 and gates the test result data TR from the memory cell array 300 to the lath unit 296 in the test mode. The switching unit 296 provides the ECC decoder 560 with the read codeword RCW in the normal mode and provides the test circuit 400 with the test result data TR in the test mode in response to the mode signal MS.

Figure 12:
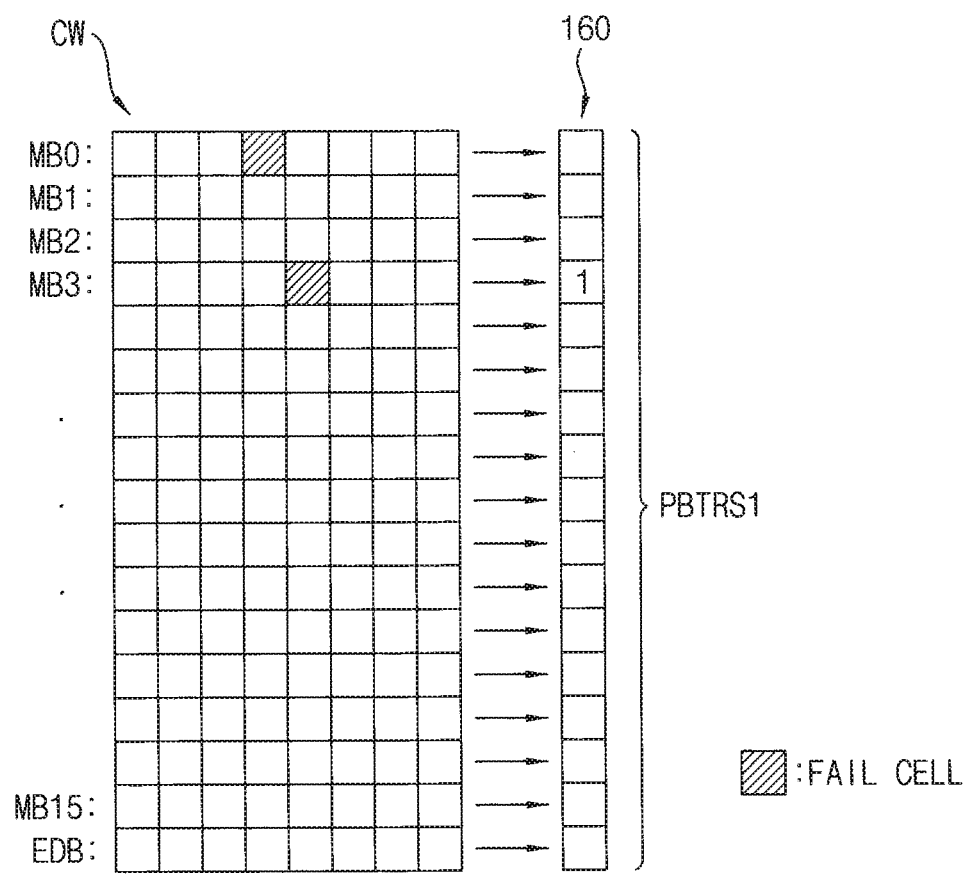
FIG. 12 illustrates an example of a first fail address memory in the memory system of FIG. 2 according to at least one example embodiment.

FIG. 12 illustrates an example of the first fail address memory in the memory system of FIG. 2.

In FIG. 12, the test pattern data on codeword CW basis is also illustrated, which is written in the first bank array 310.

In FIG. 12, it is assumed that the error correction threshold of the ECC engine 550 corresponds to one bit.

Referring to FIG. 12, the first fail address memory 160 store bits of the first test result signal PBTRS1 which is the same as the first result signal CRS1 when the error kind signal EKS indicates the uncorrectable errors, e.g., when the error kind signal EKS is high level.

In FIG. 12, the memory block MB0 has a 'fail' cell and the memory block MB3 has a 'fail' cell, and thus, a first bit and a fourth bit of the first result signal CRS1 have a logic high level. In addition, since the error correction threshold of the ECC engine 550 is one bit, a first bit of the first result signal CRS1 has a low level, and a fourth bit of the first result signal CRS1 has a high level. For example, when one 'fail' cell exists in FIG. 12, one bit of the first result signal CRS1 has a high level and the error kind signal EKS has a low level. Therefore, each bit of the first test result signal PBTRS1 has a low level and the first test result signal PBTRS1 is not recorded in the first fail address memory 160.

Figure 13:
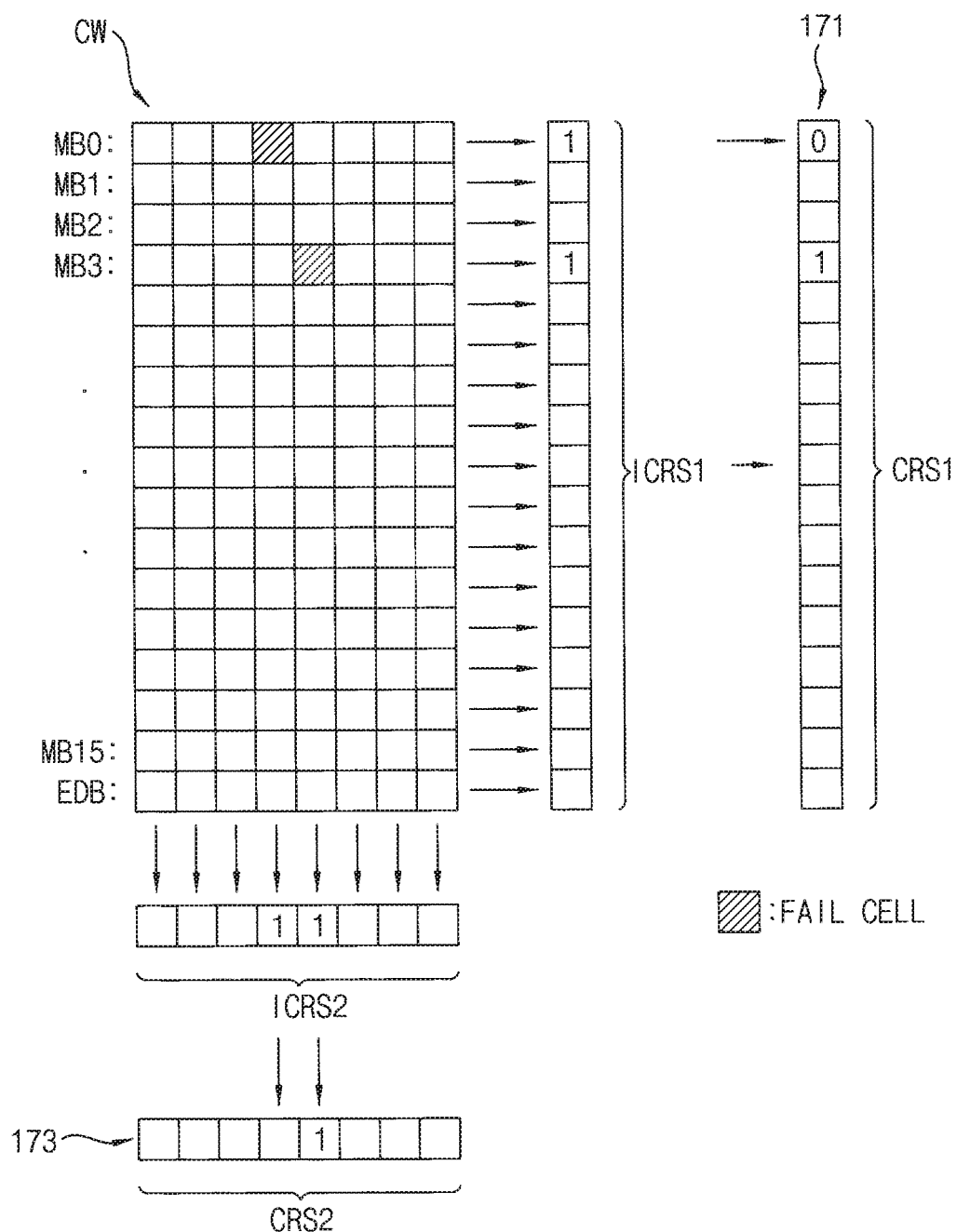
FIG. 13 illustrates an example of the second fail address memory in the memory system of FIG. 2.

FIG. 13 illustrates an example of the second fail address memory in the memory system of FIG. 2.

In FIG. 13, the error correction threshold of the ECC engine 550 is assumed to correspond to one bit.

Referring to FIG. 13, the second fail address memory 170 may include a first region 171 and a second region 173 that store bits of the first result signal CRS1 and bits of the second result signal CRS2, respectively.

In FIG. 13, the memory block MB0 has a 'fail' cell and the memory block MB3 has a 'fail' cell, and thus, a first bit and a fourth bit of the first intermediate result signal ICRS1 have a logic high level and a fourth bit and a fifth bit of the second intermediate result signal ICRS2 have a logic high level. When the error correction threshold of the ECC engine 550 is reflected, a fourth bit of the first result signal CRS1 has a logic high level, and a fifth bit of the second result signal CRS2 has a logic high level.

Figure 14:
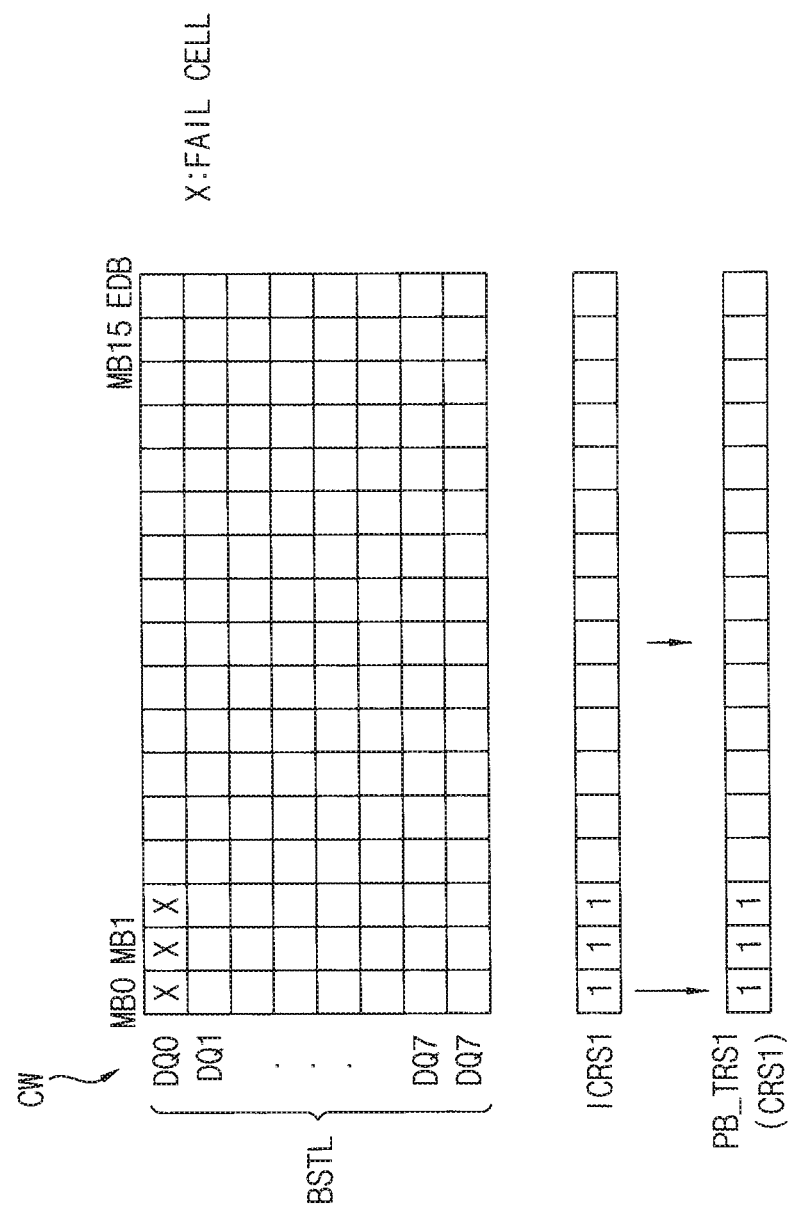
FIG. 14 illustrates the first intermediate result signal and the first result signal in the test circuit in FIG. 6.

FIG. 14 illustrates the first intermediate result signal and the first result signal in the test circuit in FIG. 6.

In FIG. 14, a codeword CW unit of test pattern data, written in the first bank array 310 in FIG. 5 is altogether illustrated.

Referring to FIG. 14, since each of the memory blocks MB0, MB1 and MB2 includes a fail cell, the codeword CW unit of test pattern data includes three error bits. Data is output from each of the memory blocks MB0~MB15 and EDB by unit of burst length BSTL through data pins DQ0~DQ7. Since each of the memory blocks MB0, MB1 and MB2 includes a fail cell, first through third bits of the first intermediate result signal ICRS1 have a logic high level. When the error correction threshold of the ECC engine 550 is subtracted from the first intermediate result signal ICRS1, second and third bits of the first result signal CRS1 have a logic high level. Information of the memory block MB0 including the fail cell is not recorded in the first fail address memory 160 and the information of the memory block MB0 is not transmitted to the first fail address memory 160.

Therefore, a number of fail bits, which are transmitted to the test device 150 may be reduced.

Figure 15:
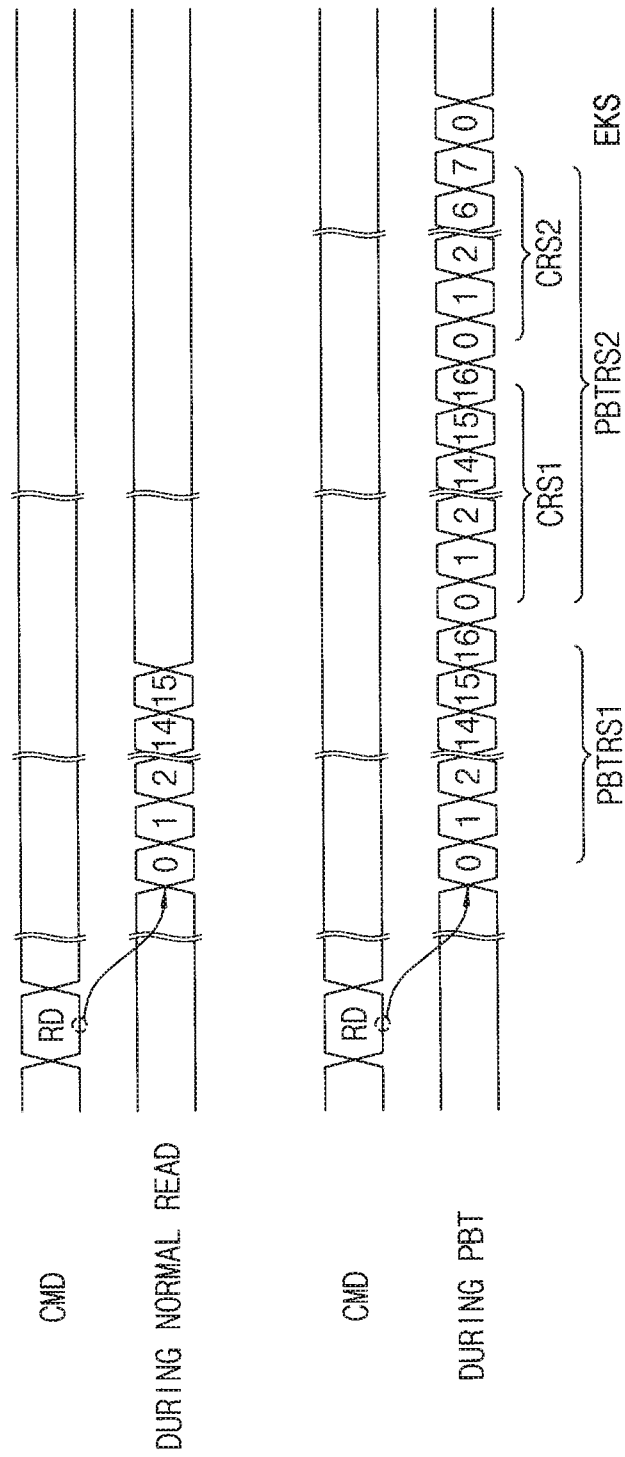
FIG. 15 is a timing diagram illustrating operation of the test circuit of FIG. 6 when the second result signal includes 8 bits according to at least one example embodiment.

FIG. 15 is a timing diagram illustrating operation of the test circuit of FIG. 6 when the second result signal includes 8 bits.

In FIG. 15, read operation of a normal mode is altogether illustrated for comparing a read operation in a test mode.

Referring to FIGS. 6 and 15, when the second result signal CRS2 includes 8 bits, the error information signal EIS is transmitted to the test device 150 through the data output path DOUT_PATH in response to a read command RD. The error information signal EIS includes the first test result signal PBTRS1, the second test result signal PBTRS2 including the first result signal CRS1 and the second result signal CRS2 and the error kind signal EKS indicating whether the uncorrectable errors are included.

Figure 16:
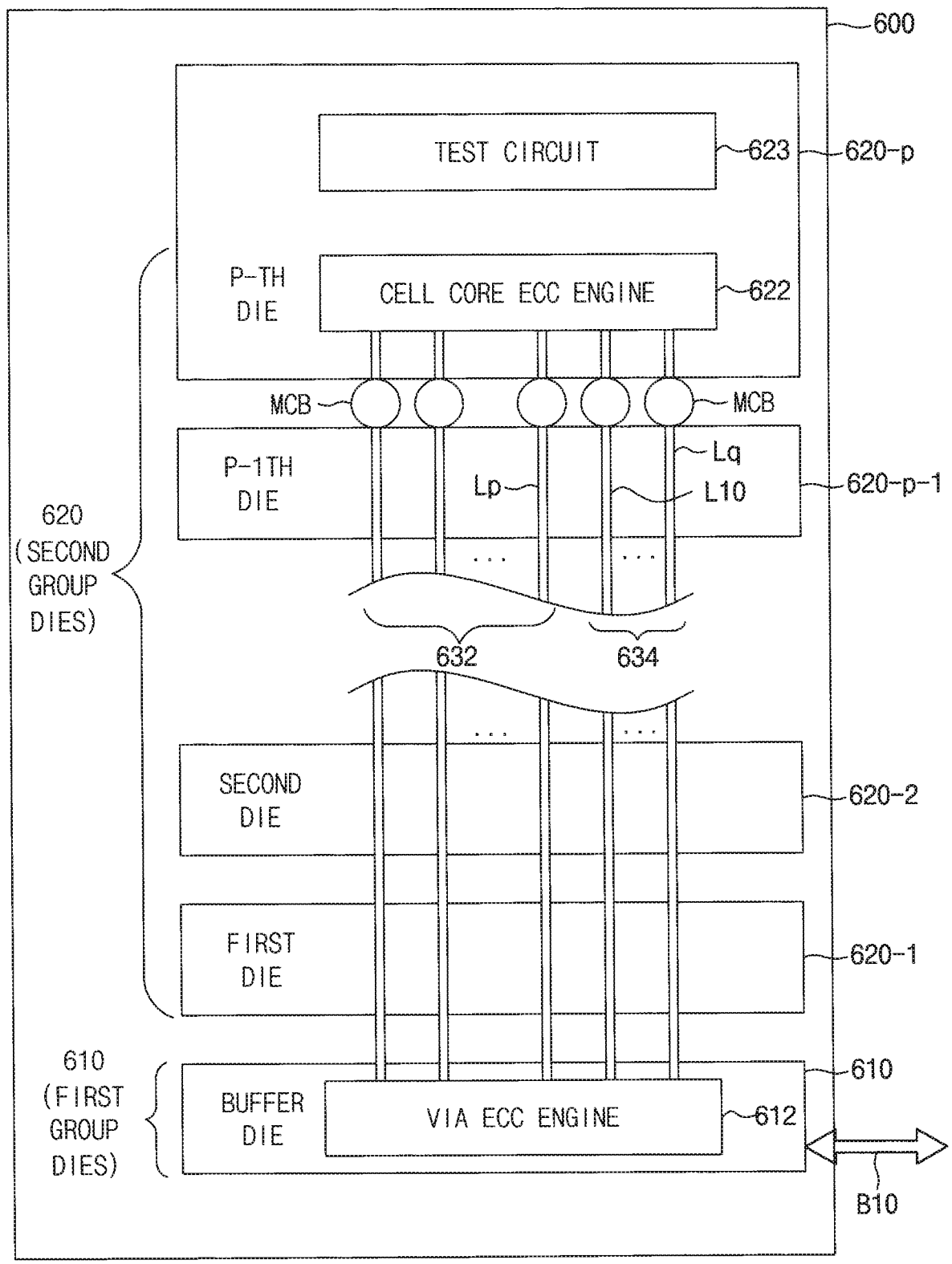
FIG. 16 is a block diagram illustrating a semiconductor memory device according to some example embodiments.

FIG. 16 is a block diagram illustrating a semiconductor memory device according to example embodiments.

Referring to FIG. 16, a semiconductor memory device 600 may include first group die 610 and second group dies 620 providing a soft error analyzing and correcting function in a stacked chip structure.

The first group die 610 may include at least one buffer die. The second group dies 620 may include a plurality of memory dies 620-1 to 620-p which are stacked on the first group die 610 and convey data through a plurality of through silicon via (TSV) lines.

At least one of the memory dies 620-1 to 620-p may include a first type ECC engine 622 which generates transmission parity bits (e.g., transmission parity data) based on transmission data to be sent to the first group die 610 and a test circuit 623. The first type ECC engine 622 may be referred to as "cell core ECC engine." The first type ECC engine 622 may employ the ECC engine 550 of FIG. 11. The test circuit 623 may employ the test circuit 400 of FIG. 6.

The buffer die 610 may include a second type ECC engine 612 which corrects a transmission error using the transmission parity bits when a transmission error is detected from the transmission data received through the TSV lines and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called "through electrodes."

The first type ECC engine 622 may perform error correction on data which is outputted from the memory die 620-p before the transmission data is sent. A transmission error which occurs in the transmission data may be due to noise which occurs at the TSV lines. Since data fail due to noise occurring at the TSV lines may be distinguishable from data fail due to a false operation of the memory die, such a fail may be regarded as a soft data fail (or a soft error). The soft data fail may be generated due to transmission fail on a transmission path, and may be detected and remedied by an ECC operation.

For example, when the transmission data is 128-bit data, the transmission parity bits may be set to 16 bits. However, inventive concepts are not limited thereto, and the number of transmission parity bits may be increased or decreased. Based on the above description, a TSV line group 632 which is formed at one memory die 620-p may include 128 TSV lines L1 to Lp, and a parity TSV line group 634 may include 16 TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor. The semiconductor memory device 600 may have a three-dimensional (3D) chip structure or a 2.5D chip structure to communicate with the host through a data bus B10. The buffer die 610 may be connected with the memory controller through the data bus B10.

The first type ECC engine 622, denoted as the cell core ECC engine, may output the transmission parity bits and the transmission data through the parity TSV line group 634 and the data TSV line group 632, respectively. The outputted transmission data may be data which is error-corrected by the first type ECC engine 622. The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error at the transmission data using the transmission parity bits. When the transmission error is uncorrectable, the second type ECC engine 612 may output information indicating occurrence of an uncorrectable data error.

When an error is detected from read data in a high-bandwidth memory (HBM) or the stacked memory structure, the error is an error occurring due to noise while data is transmitted through the TSV lines.

According to an example embodiment of inventive concepts, as illustrated in FIG. 16, the cell core ECC engine 622 may be included in the memory die, and the via ECC engine 612 may be included in the buffer die. Accordingly, detecting and correcting soft data fail may be possible. The soft data fail may include a transmission error which is generated due to noise when data is transmitted through the TSV lines.

Figure 17:
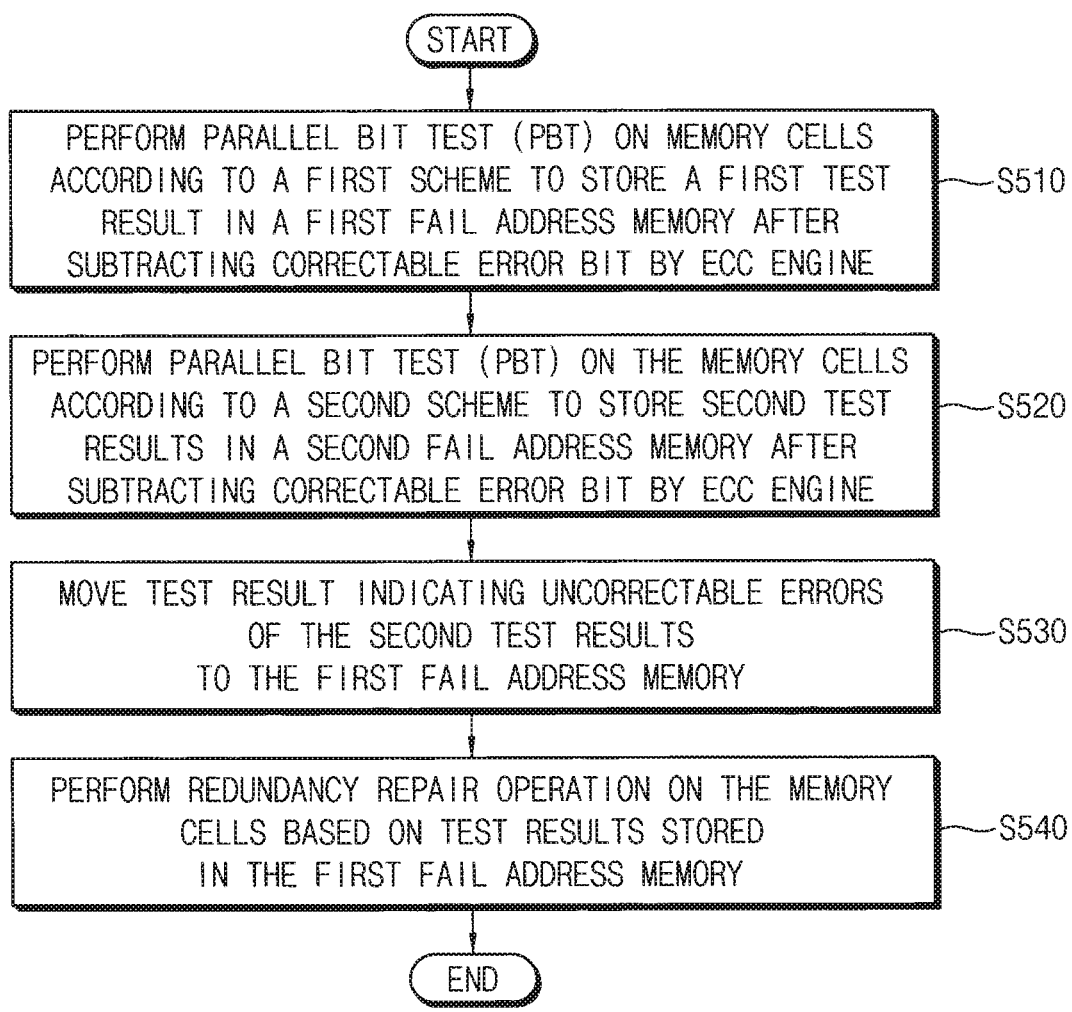
FIGS. 17 and 18 illustrate a method of operating a semiconductor memory device according to at least one example embodiment.
Figure 18:
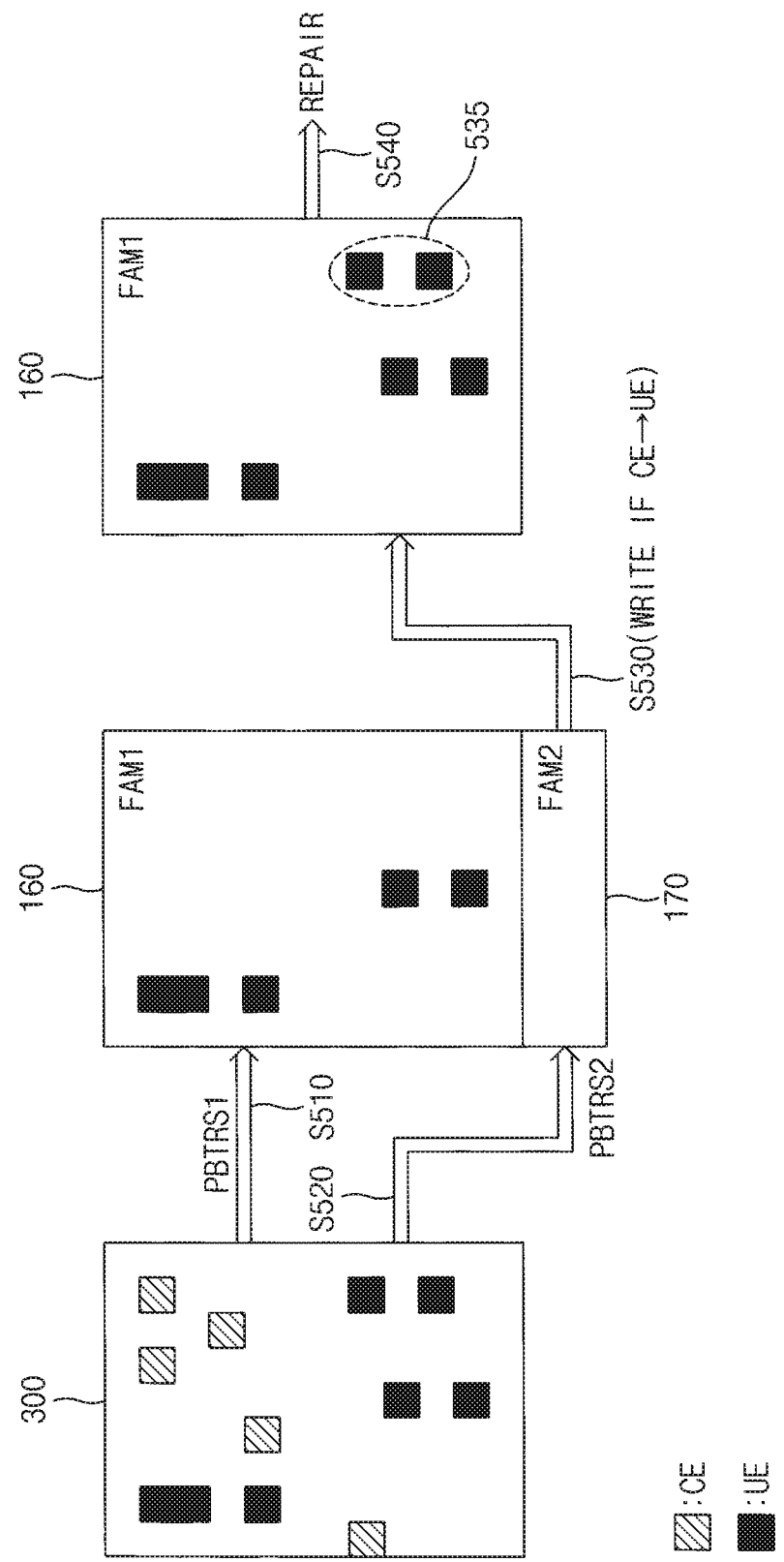

FIGS. 17 and 18 illustrate a method of operating a semiconductor memory device according to example embodiments.

Referring to FIGS. 2 through 18, when the memory cell array 300 includes correctable errors CE which the ECC engine 550 can correct and uncorrectable errors UE which the ECC engine 550 cannot correct, the test circuit 400 compares the bits of each first unit in the comparison signal CS to generate the first intermediate results signal ICRS1, and generates the first result signal CRS1 by subtracting the number of error bits which the ECC engine 550 can correct from the first intermediate results signal ICRS1 and records the first result signal CRS1 in the first fail address memory 160 as the first test result signal PBTRS1 when a number of errors in the first result signal CRS1 indicates the uncorrectable errors UE as a reference numeral S510 indicates. For example, the test circuit 400 performs a parallel bit test (PBT) on memory cells in the memory cell array 300 according to a first scheme and subtracts the number of error bits which the ECC engine 550 can correct from a result of the first test and selectively records the first test result signal PBTRS1 in the first fail address memory 160.

As a reference numeral S520 indicates, the test circuit 400 compares corresponding bits in the first units as each second unit to generate the second intermediate results signal ICRS2, and generates the second result signal CRS2 by subtracting the number of error bits which the ECC engine 550 can correct from the second intermediate results signal ICRS2 and records the first result signal CRS1 and the second result signal CRS2 in the second fail address memory 170 as the second test result signal PBTRS2. For example, the test circuit 400 performs a PBT on memory cells in the memory cell array 300 according to a second scheme and subtracts the number of error bits which the ECC engine 550 can correct from a result of the second test and records the second test result signal PBTRS2 in the second fail address memory 170.

As a reference numeral S530 indicates, the test device 150 marks the correctable errors CE in the second fail address memory 170 and moves the uncorrectable errors in the second fail address memory 170 to the first fail address memory 160 as a reference numeral indicates 535.

As a reference numeral S540 indicates, the test device 150 may control the semiconductor memory device 200 such that the fail cells associated with the uncorrectable errors are repaired by a redundancy repair operation by referring to records in the first fail address memory 160.

The test device 150 performs the PBT on memory cells in the memory cell array 300 according to the first scheme and the second scheme with respect to each of test items, and determines whether test is completed for all test items. The test circuit 400 records a first sub result in the first region 171 of the second fail address memory 170, and records a second sub result in the second region 173 of the second fail address memory 170 for each of the test items. The first sub result is a result of the comparing the bits of each first unit the second sub result is a result of the comparing the bits of each second unit for each of the test items.

When the test is not completed for all test items, the above-mentioned process is repeated. When the test is completed for all test items, the controller 155 in the test device 150 marks single-bit errors, which are correctable by the ECC engine 550, in the first region 171 in the second fail address memory 170. The controller 155 further records selected second test result (that is addresses of uncorrectable fail cells), which is associated with uncorrectable errors, of the second test result recorded in the second fail address memory 170 in the first fail address memory 160. The test device 150 controls the semiconductor memory device 200 such that the fail cells associated with the uncorrectable errors are repaired by a redundancy repair operation by referring to records in the first fail address memory 160.

In a conventional PBT, since test results are merged on burst length, detected error(s) may not be determined as a single bit error or multi-bit error. In addition, in another conventional PBT, single bit error may be accumulated but time overhead may be increased when a number of fail bits increases. Due to the continuing shrink in fabrication design rule of DRAMs, bit errors of memory cells in the DRAMs may rapidly increase. However, according to example embodiments of inventive concepts, when a semiconductor memory device employs an error correction code, test time overhead may be reduced while performing PBT and uncorrectable errors may be prevented, or reduced, from being interpreted as correctable errors. In addition, a number of fail bits which are transmitted to the fail address memory may be reduced.

Figure 19:
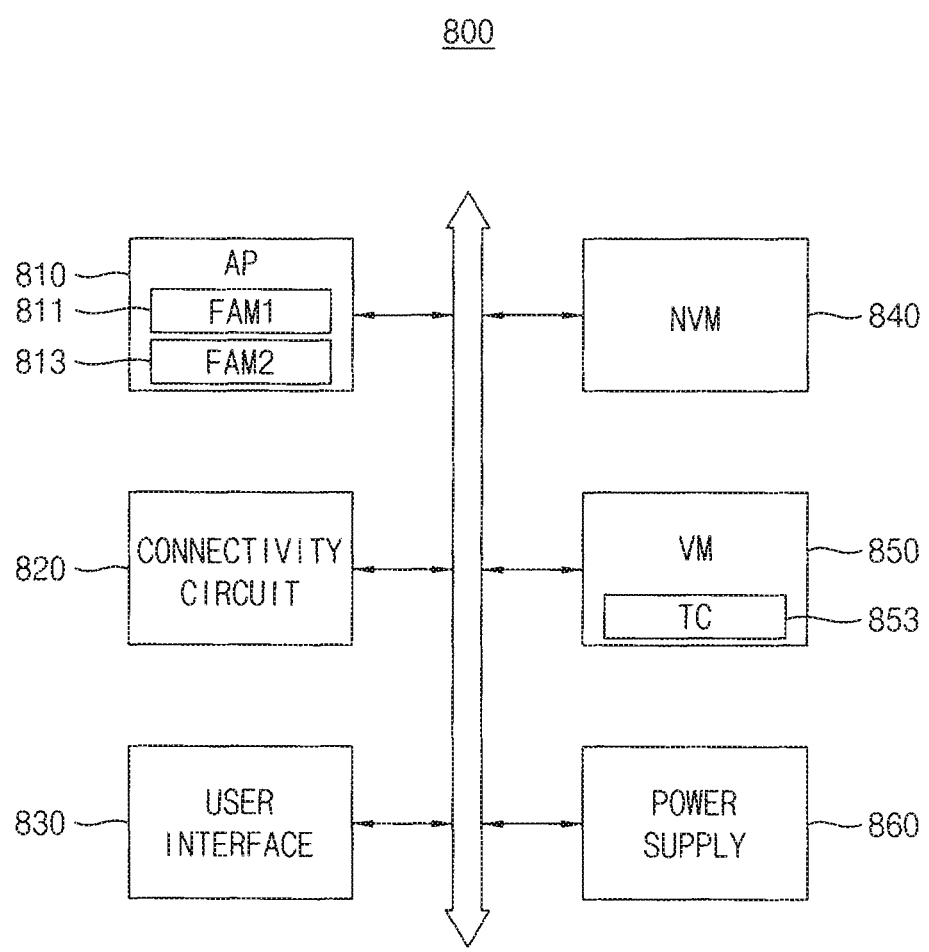
FIG. 19 is a block diagram illustrating a mobile system including the semiconductor memory device according to at least one example embodiment.

FIG. 19 is a block diagram illustrating a mobile system including the semiconductor memory device according to example embodiments.

Referring to FIG. 19, a mobile system 800 may include an application processor 810, a connectivity circuit 820, a semiconductor memory device 850, a nonvolatile memory device 840, a user interface 830 and a power supply 860.

The application processor 810 may execute applications, such as a web browser, a game application, a video player, etc. The application processor 810 may include a first fail address memory 811 and a second fail address memory 813. The connectivity circuit 820 may perform wired or wireless communication with an external device. The semiconductor memory device 850 may store data processed by the application processor 810 or operate as a working memory. The semiconductor memory device 850 may include a test circuit 853. The semiconductor memory device 850 may employ the semiconductor memory device 200 of FIG. 3. The test circuit 853 may employ the test circuit 400 of FIG. 6.

The nonvolatile memory device 840 may store a boot image for booting the mobile system 800. The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 and/or components of the mobile system 800 may be packaged in various forms.

Inventive concepts may be applied to systems using semiconductor memory devices. Inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those of ordinary skill in the art will readily appreciate that many modifications are possible in the example embodiments without materially departing from the novel teachings and advantages of inventive concepts. Accordingly, all such modifications are intended to be included within the scope of inventive concepts as defined in the claims.

What is claimed is:

1. A semiconductor memory device comprising:
    a memory cell array including a plurality of dynamic memory cells;
    an error correction code (ECC) engine configured to correct at least one error in a read data from the memory cell array; and
    a test circuit configured to perform a test on the memory cell array in a test mode of the semiconductor memory device by writing a test pattern data in the memory cell array and by reading test result data from the memory cell array, the test result data corresponding to the test pattern data,
    wherein, in the test mode, when the test result data includes at least one error bit, the test circuit is configured to subtract a second number from a first number of the at least one error bit and is configured to output the subtracted result to an outside of the semiconductor memory device, and
    wherein the second number corresponds to a number of error bits that the ECC engine is capable of correcting.

2. The semiconductor memory device of claim 1, wherein in the test mode, the test circuit is configured to:
    read a first size of the test pattern data as a first size of the test result data and compare corresponding bits of the test result data and the test pattern data;
    generate a comparison signal based on the comparison, the comparison signal including first units;
    perform a first test by comparing bits of each first unit in the comparison signal while counting a number of errors in the test result data; and perform a second test by comparing bits in the first units in the comparison signal to corresponding bits in a second unit.

3. The semiconductor memory device of claim 2, wherein the test circuit is configured to generate a first result signal by subtracting the second number from a first result of the first test and to generate a second result signal by subtracting the second number from a second result of the second test when the test result data includes the at least one error bit.

4. The semiconductor memory device of claim 1, wherein the test circuit comprises:
a first buffer that stores the test pattern data;
a second buffer that stores the test result data;
a comparator block configured to compare corresponding bits of a first size of the test pattern data and a first size of the test result data and output a comparison signal based on the comparison, the comparison signal having first units;
an error counter block configured to provide an error signal based on bits of the comparison signal, the error signal indicating whether a number of errors in the test result data exceeds an error correction threshold of the ECC engine;
a first comparison circuit configured to compare bits of each first unit in the comparison signal to output a first intermediate result signal;
a second comparison circuit configured to compare the corresponding bits in a second unit to output a second intermediate result signal;
a first selective blocking interface configured to receive the error signal and the first intermediate result signal and configured to subtract the second number from the first intermediate result signal in response to an error correction capability information signal to output a first result signal, the error correction capability information signal indicating error correction threshold of the ECC engine; and
a second selective blocking interface configured to receive the error signal and the second intermediate result signal and configured to subtract the second number from the second intermediate result signal in response to the error correction capability information signal to output a second result signal.

5. The semiconductor memory device of claim 4, further comprising:
a transmission circuit configured to perform an AND operation on the error signal and the first result signal, to transmit the first result signal to an external test device as a first test result signal, and to transmit the first result signal and the second result signal as a second test result signal to the external test device.

6. The semiconductor memory device of claim 5, wherein the transmission circuit is configured to transmit the first test result signal to the external test device only when the error signal indicates that the number of errors in the test result data exceeds the error correction threshold of the ECC engine.

7. The semiconductor memory device of claim 5, wherein the test circuit is configured to transmit the error signal, the first test result signal, and the second test result signal to the external test device through a data output path of the semiconductor memory device.

8. The semiconductor memory device of claim 1, further comprising:
first group dies including at least one buffer die; and
second group dies including a plurality of memory dies, the plurality of memory dies being stacked on the first group dies and configured to convey data through a plurality of through silicon via (TSV) lines,
wherein at least one of the plurality of memory dies includes the memory cell array, the test circuit and the ECC engine, and the ECC engine is configured to generate transmission parity bits using transmission data to be sent to the first group dies, and
the at least one buffer die includes a via ECC engine configured to correct a transmission error using the transmission parity bits when the transmission error is detected from the transmission data received through the plurality of TSV lines.

9. A memory system comprising:
a semiconductor memory device, the semiconductor memory device including a memory cell array, an error correction code (ECC) engine and a test circuit; and
a test device configured to control a test of the semiconductor memory device, the test device including a first fail address memory and a second fail address memory,
wherein, in a test mode of the semiconductor memory device, the test circuit is configured to perform a first test on the memory cell array to generate a first test result, to subtract a second number from a first number of at least one error bit of the first test result, to selectively record in the first fail address memory a first result signal associated with the first test, to perform a second test on the memory cell array, to generate a second test result, to subtract the second number from the second test result, and to record in the second fail address memory a second result signal associated with the second test, the test circuit configured to perform the first test and the second test based on a test pattern data from the test device, and
wherein the second number corresponds to a number of error bits that the ECC engine is capable of correcting.

10. The memory system of claim 9, wherein in the test mode, the test circuit is configured to:
read a first size of the test pattern data as a first size of test result data;
compare corresponding bits of the test result data and the test pattern data, and generate a comparison signal based on the comparison, the comparison signal including first units;
perform the first test by comparing bits of each first unit in the comparison signal while counting a number of errors in the test result data; and
perform the second test by comparing bits in the first units in the comparison signal to corresponding bits in a second unit.

11. The memory system of claim 10, wherein the test circuit is configured to generate the first result signal by subtracting the second number from a first result of the first test and to generate the second result signal by subtracting the second number from a second result of the second test.

12. The memory system of claim 10, wherein the test circuit is configured to record a first sub result in a first region of the second fail address memory, the first sub result being a result of the comparing the bits of each first unit, and the test circuit is configured to record a second sub result in a second region of the second fail address memory, the second sub result being a result of the comparing the bits of each second unit.

13. The memory system of claim 9, wherein the test device further includes a controller configured to manage the first fail address memory and the second fail address memory, and the test circuit is configured to perform the second test on each of a plurality of items and is configured to accumulate the second test result by reflecting the second number to record the accumulated second test result in the second fail address memory.

14. The memory system of claim 13, wherein the controller is configured to record a selected second test result of the accumulated second test result, and the selected second test result is associated with a number of uncorrectable errors that exceeds an error correction threshold of the ECC engine.

15. The memory system of claim 14, wherein the test device is configured to repair cells associated with the uncorrectable errors by redundancy repair operation by referring to the first fail address memory after the controller records the selected second test result in the first fail address memory.

16. A method of operating a semiconductor memory cell array including a memory cell array, an error correction code (ECC) engine and a test circuit, the method comprising:

performing, by the test circuit, a parallel bit test (PBT) on a plurality of dynamic memory cells in the memory cell array according to a first scheme to generate a first test result;

subtracting a second number from a first number of at least one error bit of the first test result;

selectively recording a first result signal in a first fail address memory, the second number corresponding to a number of error bits that the ECC engine is capable of correcting;

performing, by the test circuit, a PBT on the plurality of dynamic memory cells according to a second scheme to generate a second test result, the PBT including subtracting the second number from the second test result;

recording a second result signal in a second fail address memory;

recording selected second test result of the at least one second test result in the first fail address memory, wherein the selected second test result is associated with uncorrectable errors exceeding an error correction threshold of the ECC engine; and performing a redundancy repair operation on cells of the memory cells associated with the uncorrectable errors by referring to the first fail address memory.

17. The method of claim 16, wherein the first result signal is recorded in the first fail address memory when a number of errors indicated by the first test result exceeds the error correction threshold of the ECC engine.

* * * * *